(12) United States Patent
Ting et al.

(10) Patent No.: US 9,082,705 B2
(45) Date of Patent: Jul. 14, 2015

(54) METHOD OF FORMING AN EMBEDDED MEMORY DEVICE

(75) Inventors: Yu-Wei Ting, Taipei (TW); Kuo-Ching Huang, Hsinchu (TW); Chih-Yang Pai, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 336 days.

(21) Appl. No.: 13/566,710

(22) Filed: Aug. 3, 2012

(65) Prior Publication Data

US 2014/0035020 A1    Feb. 6, 2014

(51) Int. Cl.
| | |
|---|---|
| H01L 21/336 | (2006.01) |
| H01L 21/4763 | (2006.01) |
| H01L 21/31 | (2006.01) |
| H01L 21/28 | (2006.01) |
| H01L 29/423 | (2006.01) |
| H01L 29/66 | (2006.01) |
| H01L 29/792 | (2006.01) |

(52) U.S. Cl.
CPC .... *H01L 21/28282* (2013.01); *H01L 29/42344* (2013.01); *H01L 29/66833* (2013.01); *H01L 29/792* (2013.01)

(58) Field of Classification Search
USPC .......... 438/257, 778, 264, 267, 592–593; 257/E21.209, E21.422, E21.682, 257/E21.68
See application file for complete search history.

(56) References Cited

U.S. PATENT DOCUMENTS

| | | | |
|---|---|---|---|
| 6,642,573 B1 * | 11/2003 | Halliyal et al. | 257/316 |
| 2009/0020800 A1 * | 1/2009 | Tempel et al. | 257/316 |
| 2009/0032495 A1 * | 2/2009 | Ko et al. | 216/37 |
| 2013/0032869 A1 * | 2/2013 | Toh et al. | 257/314 |
| 2013/0037890 A1 | 2/2013 | Tseng et al. | |
| 2013/0292794 A1 * | 11/2013 | Pai et al. | 257/532 |

* cited by examiner

*Primary Examiner* — Mohsen Ahmadi
(74) *Attorney, Agent, or Firm* — Haynes and Boone, LLP

(57) ABSTRACT

The present disclosure describes a method of forming a memory device. The method includes receiving a wafer substrate, forming a poly stack pattern on the wafer substrate, performing an ion implantation process to form a source and a drain in the wafer substrate, forming a memory gate and a control gate in the defined poly stack pattern, and forming a control gate in the control poly stack pattern. Forming the memory gate further includes performing a memory gate recess to bury the memory gate in an oxide layer.

19 Claims, 11 Drawing Sheets

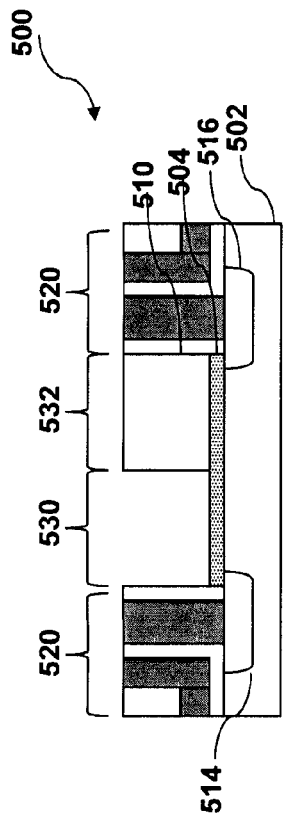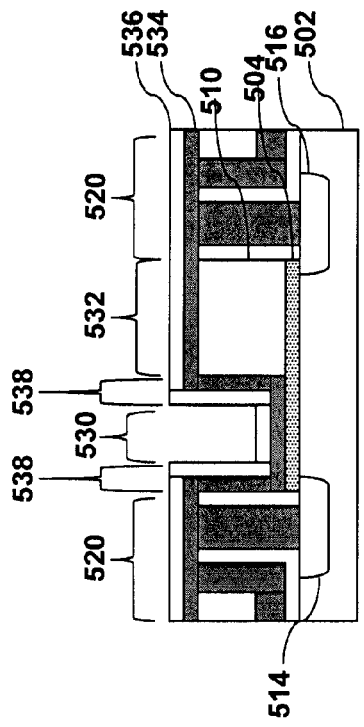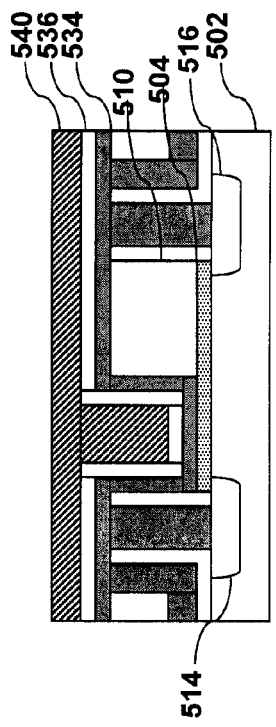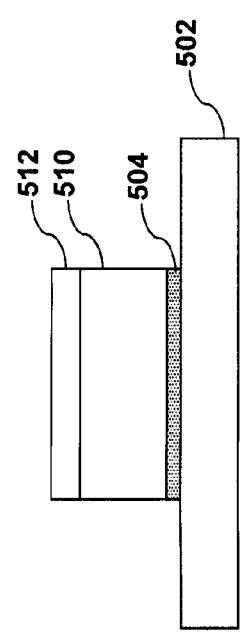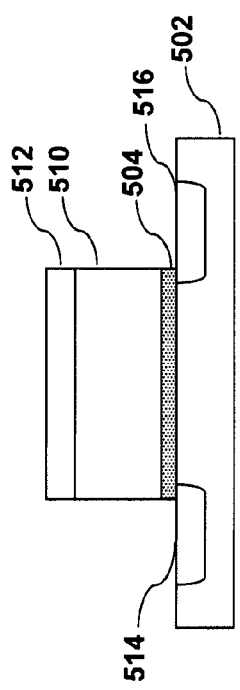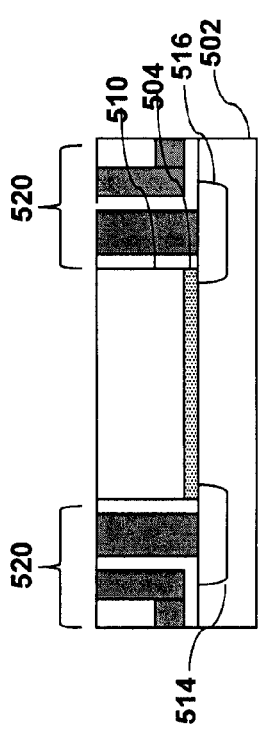
FIG. 23
FIG. 24
FIG. 25
FIG. 26
FIG. 27
FIG. 28

METHOD OF FORMING AN EMBEDDED MEMORY DEVICE

BACKGROUND

A typical flash memory device includes a memory array having a large number of memory cells arranged in blocks. Each of the memory cells includes a field effect transistor having a control gate and a floating gate. The floating gate holds a charge and is separated from source and drain regions in a substrate by an oxide. Each memory cell can be electrically charged by electrons injected onto the floating gate. The charge may be removed from the floating gate by an erase operation. The data in flash memory cells are thus determined by the presence or absence of charge in the floating gates.

It is a trend in memory devices to scale down the device size for packing density and cost. In a conventional flash memory structure, it is a challenge to shrink the word line length due to conflicting factors. For example, for a typical split gate flash memory device, a memory gate of the device depends on the control gate of the device. If scaling down the control gate, the memory gate thickness may become too thin. An associated ion implantation may penetrate the thin memory gate, causing the memory gate to not long work.

Accordingly, what is needed are a method and a device that address the above issues.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIGS. 23-34 are cross sectional views of forming a memory device for implementing one or more embodiments of the present disclosure.

DETAILED DESCRIPTION

Figure 1:
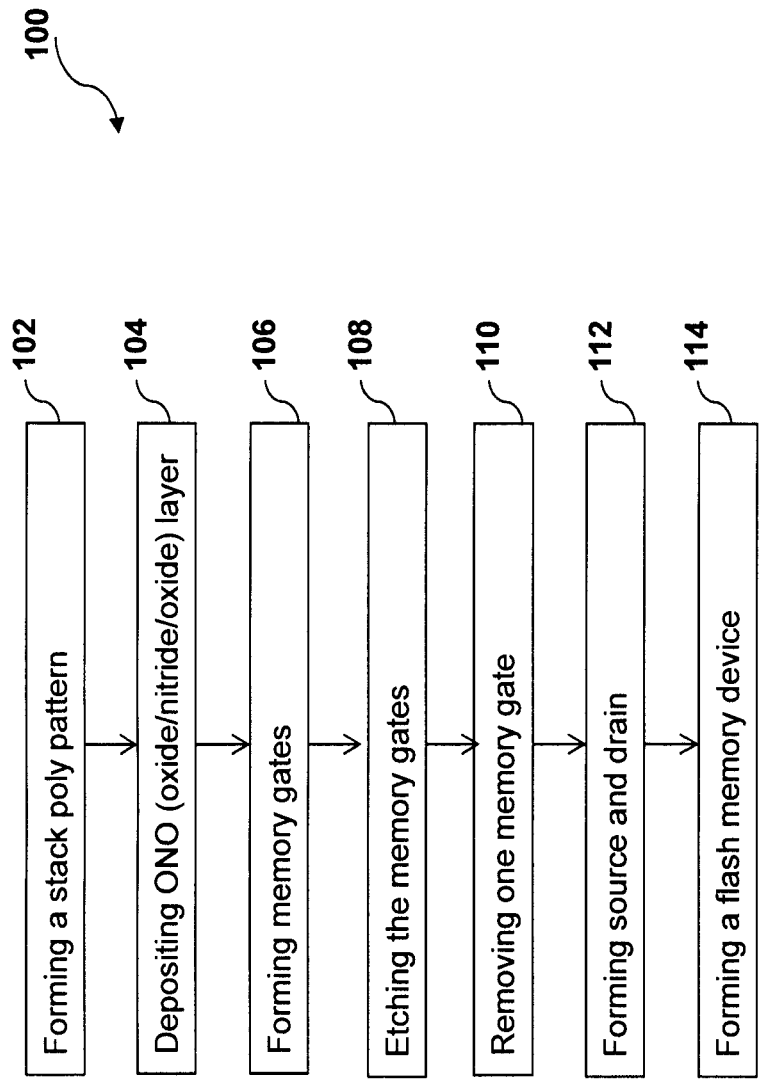
FIG. 1 is a flow chart of a method of fabricating a memory device according to one or more embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
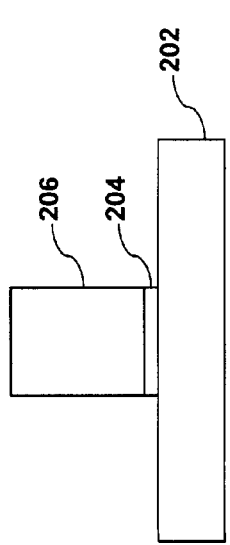
FIGS. 2-7 are cross sectional views of forming a memory device according to one or more embodiments of the present disclosure.

Referring now to FIG. 1, a flow chart of a method 100 to form a flash memory structure 200 is presented according to one or more embodiments of the present disclosure. FIGS. 2-7 are cross sectional views of forming the flash memory structure 200 by the method 100 according to some embodiments. In some embodiments, a flash memory structure is also referred to as a memory structure. The method 100 begins at step 102 by forming a control gate as shown in FIG. 2. The step 102 includes receiving a substrate 202, depositing a tunneling layer 204 over the substrate 202, depositing a polysilicon layer 206 over the tunneling layer 204, and forming the control gate over the substrate 202 as shown in FIG. 2. The step 102 also includes a lithography process to form a photo resist pattern, an etching process and a cleaning process to form a patterned polysilicon stack.

Figure 3:
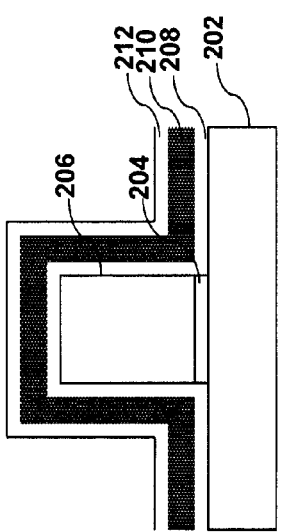

The method 100 proceeds to step 104 by depositing an oxide-nitride-oxide layer over the control gate 206 as shown in FIG. 3. The step 104 includes depositing a silicon oxide layer 208 over the control gate 206 and the substrate 202, depositing a silicon nitride layer 210 over the silicone oxide layer 208, and depositing a silicon oxide layer 212 over the silicon nitride layer 210. In some embodiments, the step 104 is also referred to as depositing an ONO (oxide-nitride-oxide) layer.

Figure 4:
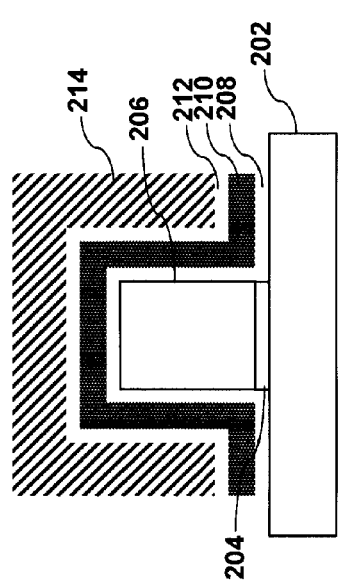
Figure 5:
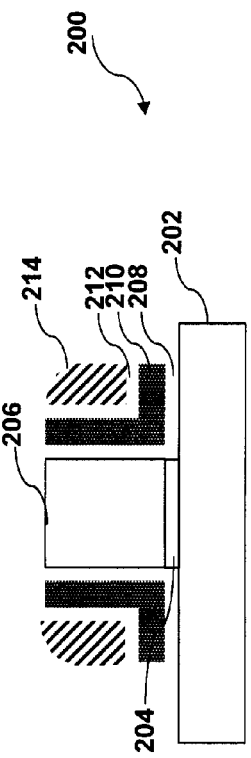
Figure 6:
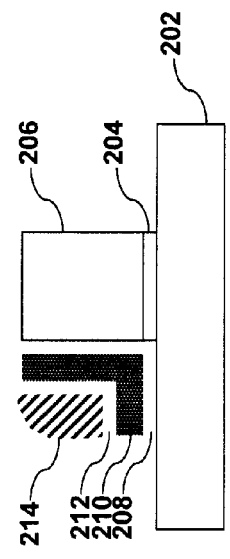

The method 100 proceeds to step 106 by forming a memory gate as shown in FIG. 4. The step 106 includes depositing a memory gate layer 214 over the silicon oxide layer 212. The step 106 also includes applying a lithography process, an etching process, and a cleaning process to form the memory gate 214 as shown in FIG. 4. In some embodiments, the memory gate layer 214 is also referred to as the memory gate 214. The method 100 proceeds to step 108 by further etching the memory gate 214. The step 108 includes removing portion of the memory gate layer 214, the silicon oxide layer 212, the silicon nitride layer 210, and the silicon oxide 208 on top of the control gate 206 by etching process as shown in FIG. 5. Therefore, the control gate 206 is exposed to air. The method 100 proceeds to step 110 to remove the memory gate 214 from one side of the control gate 206. In one embodiment, the memory gate at the drain side is removed to be formed as show in FIG. 6.

Figure 7:
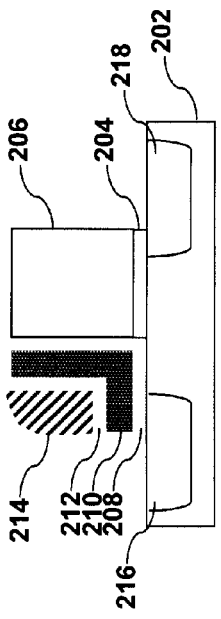

The method 100 proceeds to step 112 by performing an ion implantation process to form a source 216 and a drain 218 as shown in FIG. 7. The step may include the photo lithography process to define the ion implantation region. The method 100 proceeds to step 114 to form the flash memory structure 200. Additional steps can be provided before, during, and after the method 100, and some the steps described can be replaced, eliminated, or moved around for additional embodiments of the method 100.

As shown in FIG. 7, the flash memory structure 200 includes the substrate 202, the source 216, the drain 218, the tunneling layer 204, the control gate 206, the oxide layer 208, the nitride layer 210, the oxide layer 212, and the memory gate 214. However, other configurations and inclusion or omission of devices may be possible. In the present embodiment, the substrate 102 includes a wafer and/or a plurality of conductive and non-conductive thin films. The substrate 102 also includes various isolation features, such as shallow trench isolation (STI), formed by a process, such as a process including etching to form various trenches and then depositing to fill the trench with a dielectric material.

Figure 8:
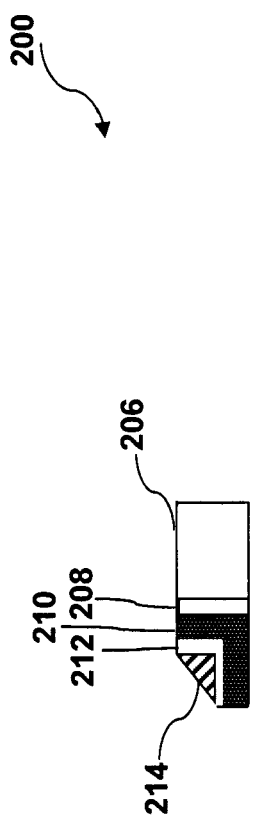
FIG. 8 is cross sectional view of a memory device according to one or more embodiments of the present disclosure.

In one example, if the tunneling layer 204 includes silicon oxide, the control gate 206 includes polysilicon, and the memory gate 214 includes polysilicon, the flash memory structure 200 is also referred to as a split gate SONOS (silicon-oxide-nitride-oxide-silicon) flash memory device. The flash memory structure 200 may have limitation for further size scaling down. As shown in FIG. 8, a shape of the memory gate 214 is influenced by height of the control gate 206. The thinner control gate 204 caused by size scaling down may result in a triangle shaped memory gate 214. The ions used in the ion implantation may penetrate the triangle shaped memory gate 120 when forming the source and the drain of the memory device. The memory gate is not working anymore for further size scaling down.

Figure 9:
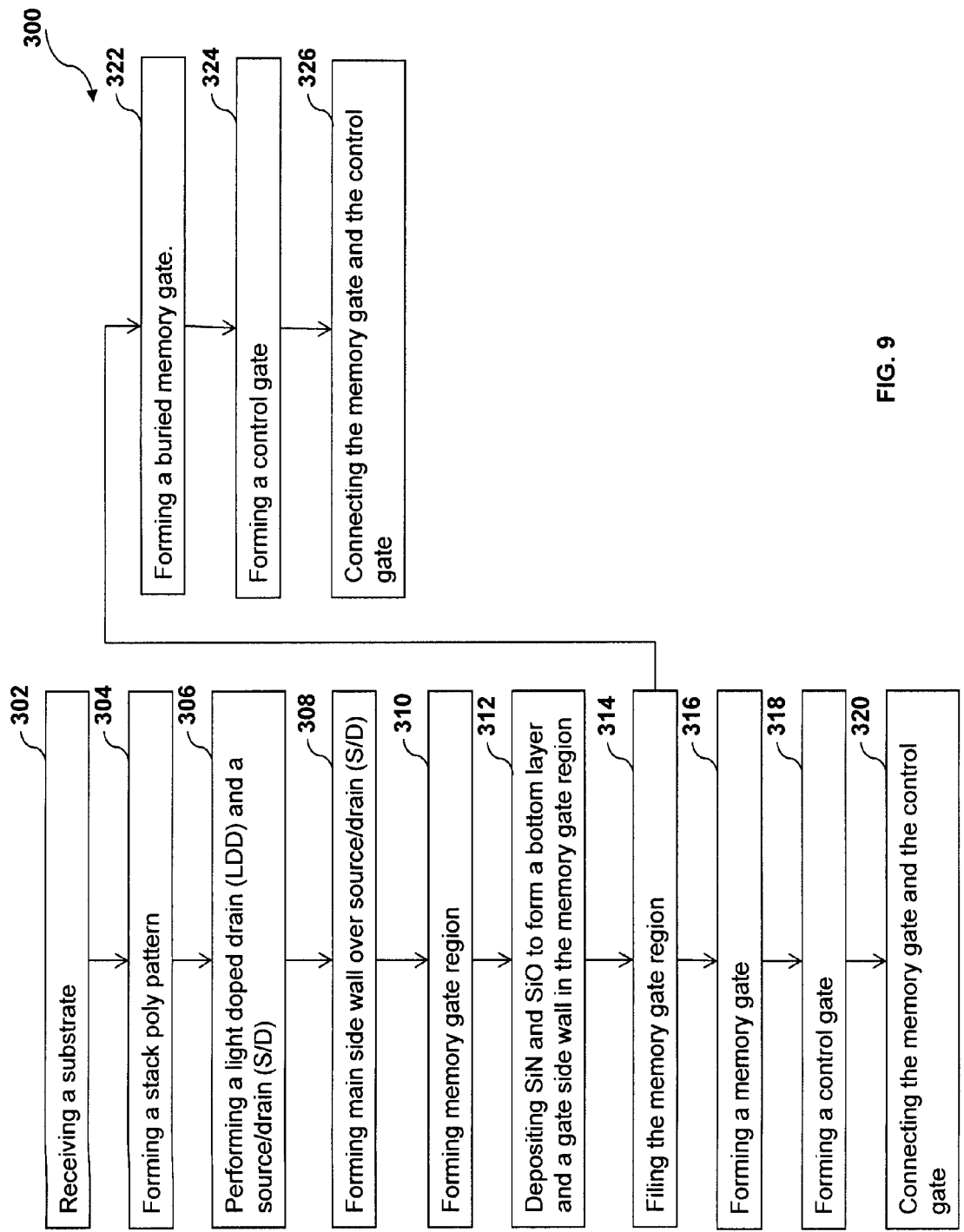
FIG. 9 is a flow chart of a method of fabricating a memory device for implementing one or more embodiments of the present disclosure.
Figure 17:
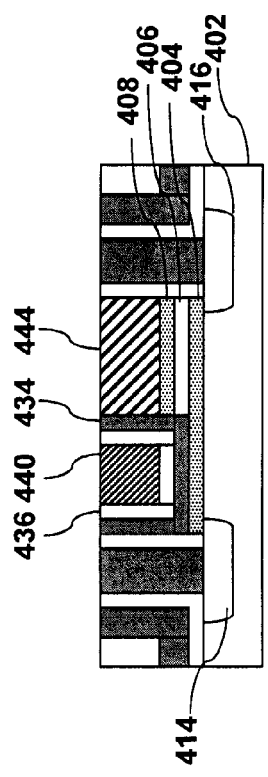
Figure 18:
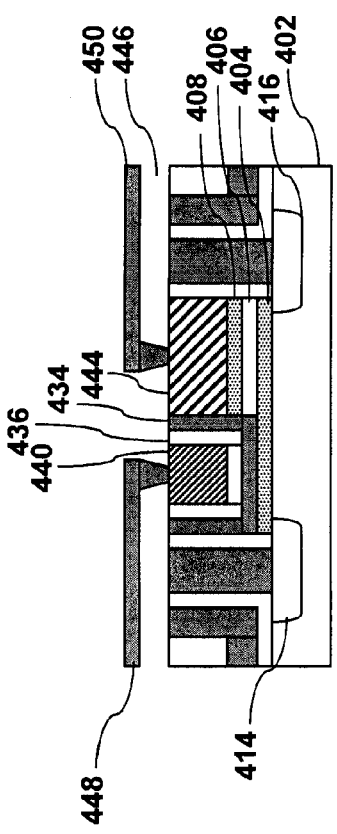
Figure 19:
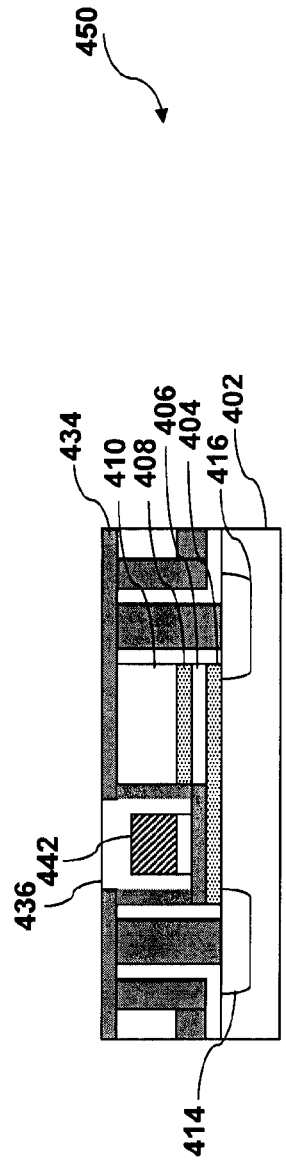
Figure 20:
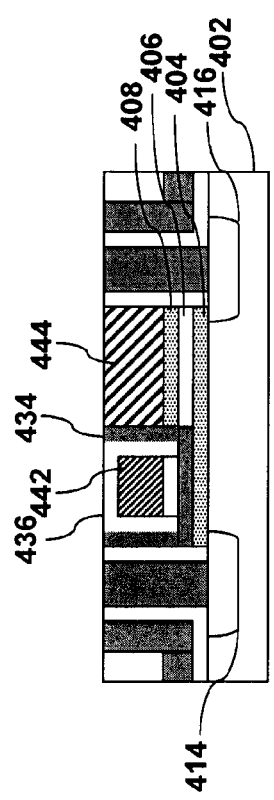
Figure 21:
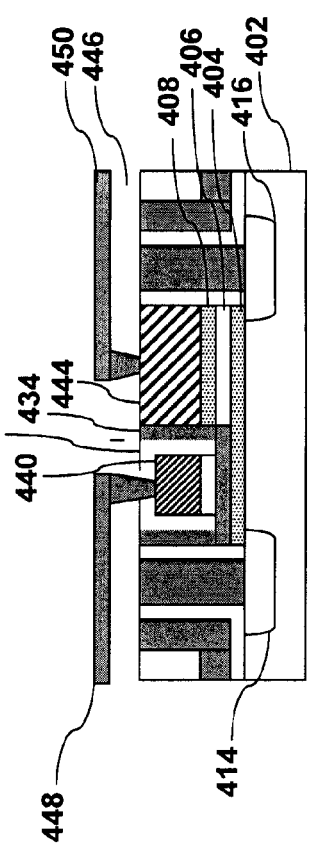

Referring now to FIG. 9, a flow chart of a method 300 of fabricating a flash memory structure 400 and a flash memory structure 450 is illustrated for implementing one or more embodiments of the present disclosure. FIGS. 10-18 are cross sectional views of forming the flash memory structure 400 using the method 300. FIGS. 19-21 are cross sectional views of forming the flash memory structure 450 using the method 300. In some embodiments, a flash memory structure is also referred to as a flash memory device or a flash memory cell. The flash memory device 400 and the flash device 450 fabricated by the method 300 are two different embodiments of the present disclosure. Different embodiments may have different advantages, and no particular advantage is necessarily required of any embodiment.

Figure 10:
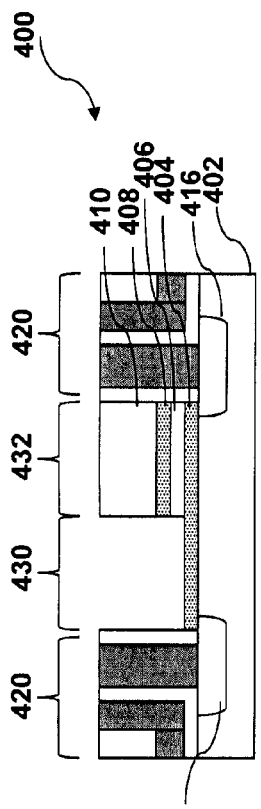
FIGS. 10-21 are cross sectional views of forming a memory device for implementing one or more embodiments of the present disclosure.

In the present embodiments, the method 300 begins at step 302 by receiving a substrate 402. The method 300 proceeds to step 304 by forming a stack poly pattern as shown in FIG. 10. The step 304 includes depositing an interfacial layer 404 over the substrate 402, depositing a high-k dielectric layer 406 over the interfacial layer 404, depositing a metal nitride layer 408 over the high-k dielectric layer 406, depositing a polysilicon layer 410 over the metal nitride layer 408, and depositing a hard mask layer 412 over the polysilicon layer 410. The step 304 may also include using a lithography process. The lithography process includes depositing a photo resist on the substrate, exposing the photo resist by an exposing tool, and developing the exposed photo resist to for a photo resist pattern. The step 304 further includes etching the photo resist pattern to form the stack poly pattern as shown in FIG. 10. The step 304 may also include a cleaning process to strip the photo resist and clean the surface after etching process.

In some embodiments, the substrate 402 includes a wafer and/or a plurality of conductive and non-conductive thin films. The wafer is a semiconductor substrate including silicon (in other words, a silicon wafer). Alternatively or additionally, the wafer includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP. In yet another alternative, the wafer is a semiconductor on insulator (SOI). The plurality of conductive and non-conductive thin films may comprise an insulator or a conductive material. For example, the conductive material comprises a metal such as aluminum (Al), copper (Cu), tungsten (W), nickel (Ni), titanium (Ti), gold (Au), and platinum (Pt) and, thereof an alloy of the metals. The insulator material may include silicon oxide and silicon nitride. The substrate 102 further includes various doped features, such as n-type wells and/or p-type wells, formed by ion implantation or diffusion. The substrate 102 also includes various isolation features, such as shallow trench isolation (STI), formed by a process, such as a process including etching to form various trenches and then depositing to fill the trench with a dielectric material.

In some embodiments, the interfacial layer 404 is used as a tunneling oxide layer. The interfacial layer 404 includes silicon oxide (SiO) formed by a thermal oxidation process or a chemical vapor deposition (CVD) process. The high-k dielectric layer 406 may include a metal oxide (MOx), a metal silicon oxide (MSixOy), a metal oxide nitride (MOxNy), or a silicon oxide nitride (SiOxNy). The metal nitride layer 408, such as metal nitride, is used to increase adhesion between the high-k dielectric layer 406 and the polysilicon layer 410. Other material may be possible to replace the metal nitride. The hard mask layer 412 may include silicon nitride, silicon oxide, or combination of both.

Figure 11:
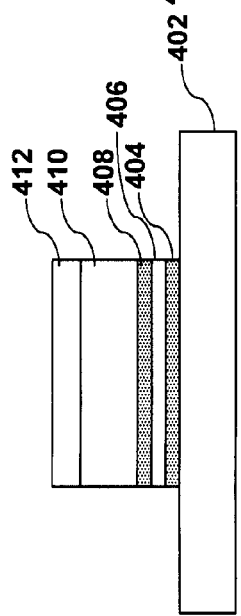
Figure 12:
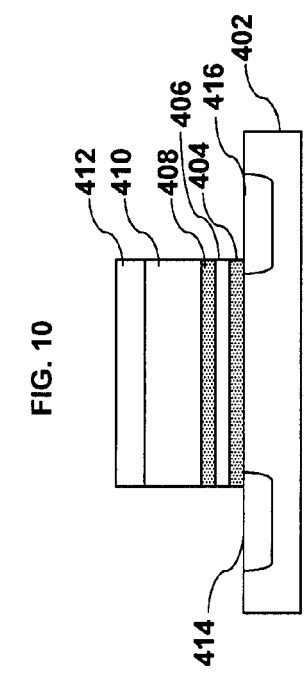
Figure 13:
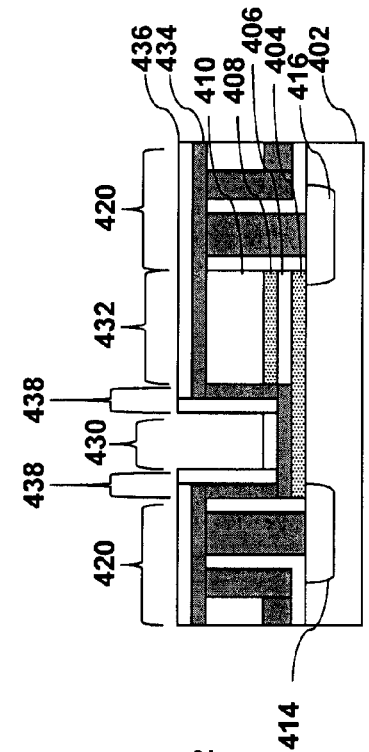

After step 304, the method 300 proceeds to step 306 by forming a light dope drain (LDD) by an ion implantation process. The step 306 further includes performing the ion implantation process to form a source 414 and a drain 416 as shown in FIG. 11. The method 300 proceeds to step 308 by forming a main sidewall (MSW) spacer 420 over the source 414 and the drain 416 as shown in FIG. 12. The step 308 also includes forming an inter-layer dielectric deposition (ILD0). MSW spacer and ILD0 are the combination of oxide and nitride film. The step 308 further includes removing the hard mask layer 412 using the etching process, a chemical mechanical polishing (CMP) process, or combination thereof. The method 300 proceeds to step 310 by forming a memory gate region 430 and a control gate region 432 as shown in FIG. 13. The step 310 includes applying the lithography process to define the memory gate region 430. The step 310 also includes using the etching process to remove the polysilicon layer 410, the metal nitride layer 408, and the high-k dielectric layer 406 in the memory gate region 430. The etching process stops at the interfacial layer 404.

Figure 14:
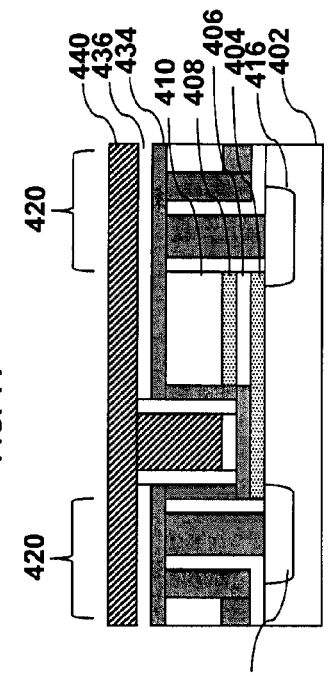
Figure 15:
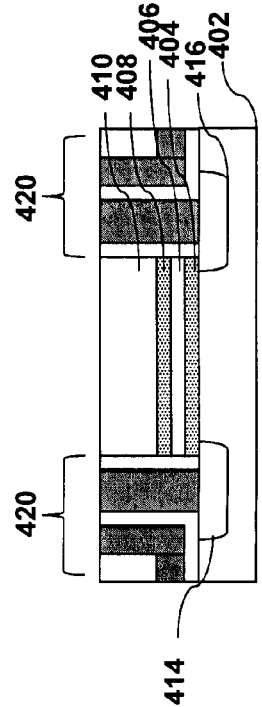

The method 300 continues to proceed to step 312 by depositing a silicon nitride layer 434 over the interfacial layer 404 and depositing a silicon oxide layer 436 over the silicon nitride layer 434 in the memory gate area 430 as shown in FIG. 14. In addition to SiN and SiO2, silicon nanocrystal (Si-ncs) and Hi-K material (e.g. Al2O3) can be used for 434 and 436, respectively. In some embodiments, as shown in FIG. 14, the interfacial layer 404, the silicon nitride layer 434 and the silicon oxide 436 form an ONO (oxide-nitride-oxide) bottom in the memory gate region 430. The silicon nitride layer 434 and the silicon oxide 436 form a NO (nitride-oxide) gate sidewall 438 to isolate the memory gate region 430 and the control gate region 432. The method 300 proceeds to step 314 by filling the memory gate region 432 as shown in FIG. 15. The step 314 includes depositing the memory gate 440 into the memory gate region. The memory gate 440 includes a polysilicon, a metal, or a metal alloy.

Figure 16:
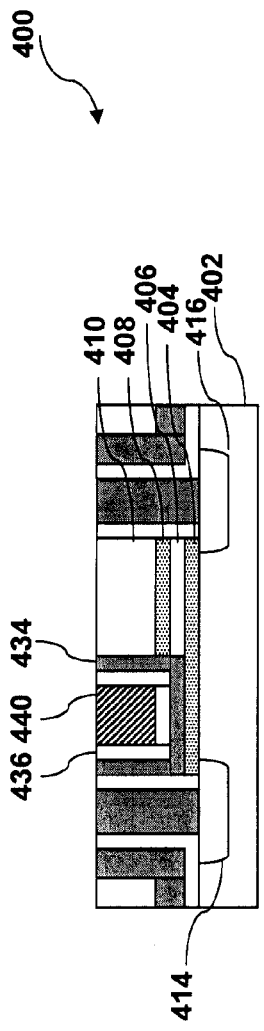

As shown in FIG. 9, after step 314, the method 300 may proceed in two different routes. In one embodiment, the method 300 may proceed to step 316 by forming the memory gate 440 as shown in FIG. 16. The step 316 includes removing the memory gate layer 440 outside the memory gate region 430, the oxide layer 438, and the nitride layer 436 shown in FIG. 15 using an etching process, a CMP process, or a combination thereof. The method 300 proceeds to step 318 to form a control gate 444 as shown in FIG. 17. The step 318 includes using a lithography process to define the control gate region, removing the polysilicon layer 410 using an etching process, and filling the control gate region 432 with a metal or a metal alloy deposition. The step 320 may also include a CMP process. The method 300 proceeds to step 320 by forming a metal line 448 connecting the memory gate 440 and a metal line 450 connecting the control gate 444 as shown in FIG. 18 by a back end of line (BOEL) process. The step 320 may include depositing a protection layer 446 over the top of the structure. The protection layer 446 may include SiN, SiO, or a compound thereof. The step 320 further includes using lithograph and etching processes to define the location and the critical dimension (CD) of the metal line 448 and the metal line 450. The step 320 also includes metal deposition and the CMP process to form the metal line 448 and the metal line 450. In the embodiment of fabricating the memory structure 400, additional steps can be provided before, during, and after the method 300, and some the steps described can be replaced, eliminated, or moved around for additional embodiments of the method 300.

As shown in FIG. 9, in another embodiment, after step 314, the method 300 may proceed in another route for fabricating the flash memory structure 450. The method 300 may proceed to step 322 by forming a buried memory gate 442 as shown in FIG. 19. The step 322 includes removing the gate layer 440 outside the memory gate region 430 and the oxide layer 438 as shown in FIG. 15 using an etching process, a CMP process, or a combination thereof. The step 322 also include recessing the memory gate 440 in the memory gate region 430 and depositing the oxide on the top forming the buried memory gate 442 surrounding by the oxide layer 436 as shown in FIG. 19. The method 300 proceeds to step 324 to form a control gate 444 as shown in FIG. 20. The step 324 includes using the lithography process to define the control gate region 432, removing the polysilicon layer 410 using an etching process, and filling the control gate region 432 with a metal or a metal alloy. The step 322 may also include using a CMP process. The method 300 proceeds to step 324 by forming a metal line 448 connecting the buried memory gate 442 and a metal line 450 connecting the control gate 444 as shown in FIG. 21 by the BOEL process. The step 326 may include depositing a protection layer 446 over the top of the structure. The protection layer 446 may include SiN, SiO, or a compound thereof. The step 326 further includes using lithograph and etching processes to define the location and the CD of the metal line 448 and the metal line 450. The step 322 also includes metal deposition and the CMP process to form the metal line 448 and the metal line 450. In the embodiment of fabricating the memory structure 450, additional steps can be provided before, during, and after the method 300, and some the steps described can be replaced, eliminated, or moved around for additional embodiments of the method 300.

Figure 22:
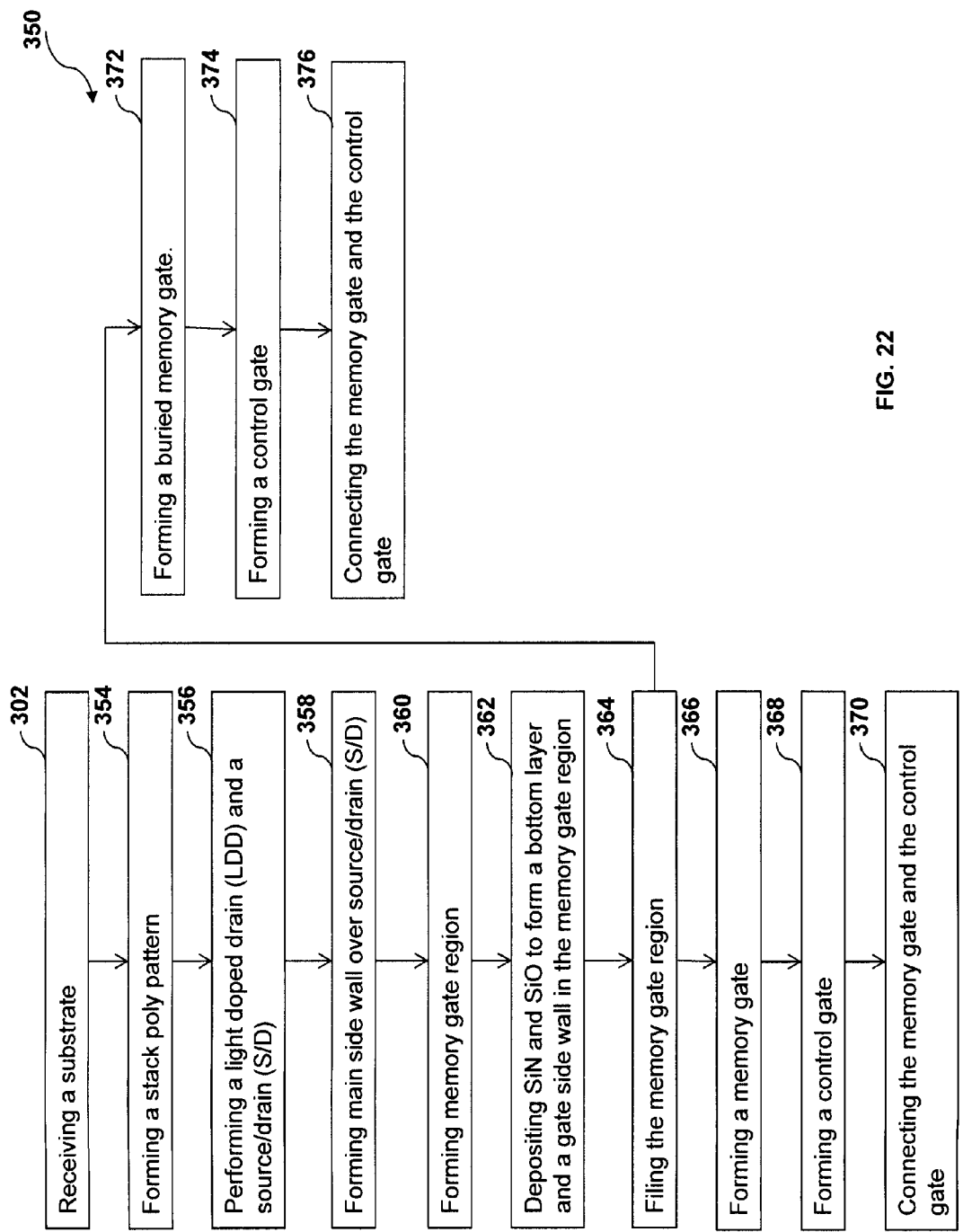
FIG. 22 is a flow chart of a method of fabricating a memory device for implementing one or more embodiments of the present disclosure.
Figure 30:
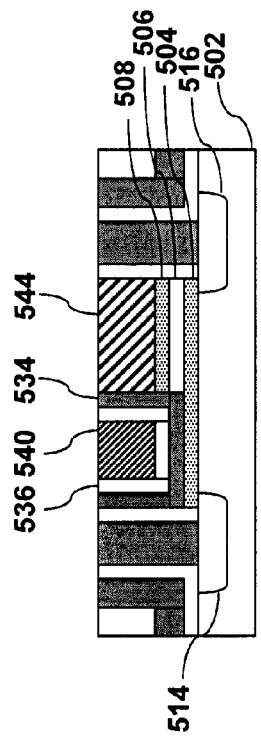
Figure 31:
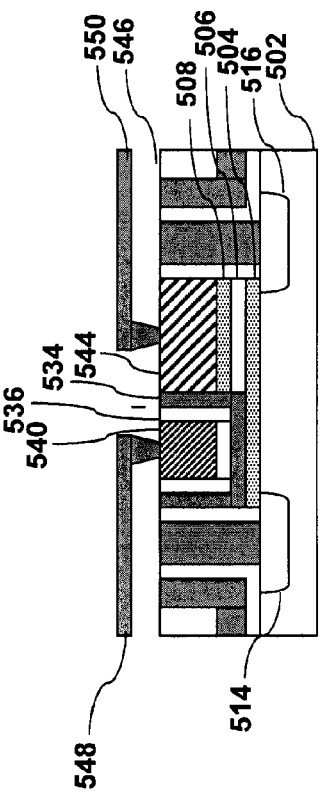
Figure 32:
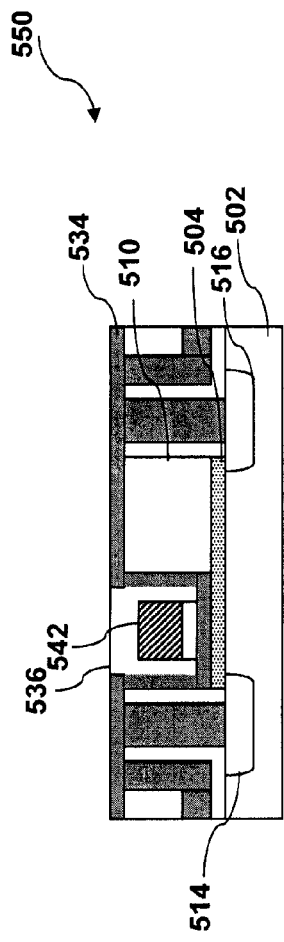
Figure 33:
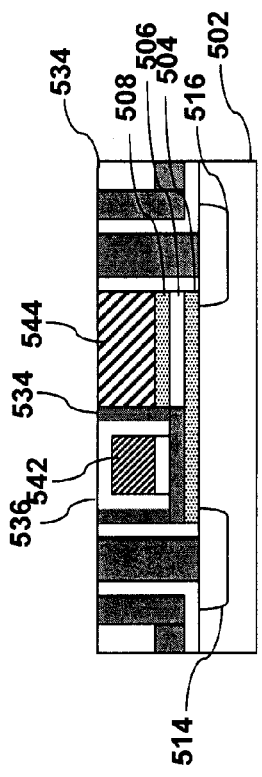
Figure 34:
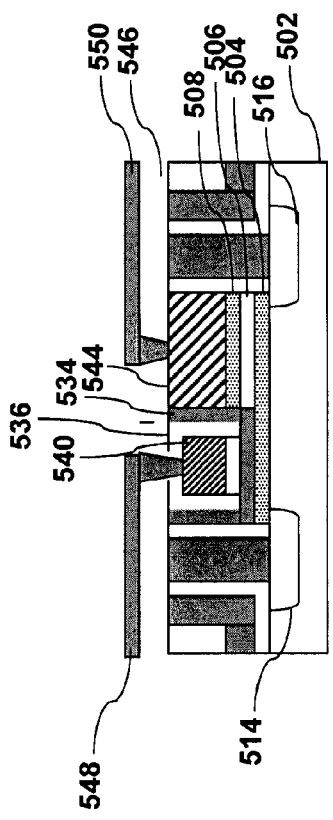

Referring now to FIG. 22, a flow chart of a method 350 of fabricating a flash memory structure 500 and the flash structure 550 is illustrated for implementing one or more embodiments of the present disclosure. FIGS. 23-31 are cross sectional views of forming the flash memory device 500 using the method 350. FIGS. 32-34 are cross sectional views of forming the flash memory device 550 using the method 350. In some embodiments, a memory structure is also referred to as a memory device or a memory cell. The method 350 is an alternative embodiment making the flash memory structure 400 and the flash memory structure 450 using the method 300 discussed early. Different embodiments may have different advantages, and no particular advantage is necessarily required of any embodiment.

The method 350 begins at step 352 by receiving a substrate 502. The substrate 502 may be similar to or same as the substrate 402 as discussed in step 302 of the method 300. All materials are used as the substrate 402 of the device 400 or the device 450 can be used as the substrate 502 of the device 500 or the device 550 to be formed. The method 350 proceeds to step 354 by forming a stack poly pattern as shown in FIG. 23. The step 354 includes depositing an interfacial layer 504 over the substrate 502, depositing a polysilicon layer 510 over the interfacial layer 504, and depositing a hard mask layer 512 over the polysilicon layer 410. The step 354 may include forming the photo resist pattern by using the lithography process to define the CD size of the stack poly pattern. The step 354 further includes etching the photo resist pattern to form the stack poly pattern as shown in FIG. 23. The step 354 may also include a cleaning process to strip the photo resist and clean the surface after etching.

The method 350 continues to proceed to step 356 by forming a light dope drain (LDD). The step 356 further includes performing the ion implantation to form a source 514 and a drain 516 as shown in FIG. 24. The method 350 proceeds to step 358 by forming a main sidewall spacer (MSW) 520 over the source 514 and the drain 516 as shown in FIG. 25. The step 358 also includes an inter-layer dielectric deposition (ILD0). MSW spacer and ILD0 are the combination of oxide and nitride film. The step 358 further includes removing the hard mask layer 512 using an etching process, a CMP process, or a combination thereof. The method 350 proceeds to step 360 by forming a memory gate region 430 and a control gate region 432 as shown in FIG. 26. The step 360 includes applying a lithography process to define the memory gate region 430. The step 360 also includes using an etching process to remove the polysilicon layer 510 in the memory gate region 530. The etching process stops at the interfacial layer 504.

The method 350 continues to proceed to step 362 by depositing the silicon nitride layer 534 over the top of the structure and depositing the silicon oxide layer 536 over the silicon nitride layer 534 as shown in FIG. 27. In addition to SiN and SiO2, silicon nanocrystal (Si-ncs) and Hi-K material (e.g. Al2O3) can be used for 434 and 436, respectively. In some embodiments, as shown in FIG. 27, the interfacial layer 504, the silicon nitride layer 534 and the silicon oxide 536 form the ONO (oxide-nitride-oxide) bottom in the memory gate region 530. The silicon nitride layer 534 and the silicon oxide 536 form the NO (nitride-oxide) gate side wall 538 to isolate the memory gate region 530 and the control gate region 532. The method 350 proceeds to step 364 by filling the memory gate region 532 as shown in FIG. 28. The step 364 includes depositing the memory gate material into the memory gate region. The memory gate 540 includes a polysilicon, a metal, or a metal alloy.

Figure 29:
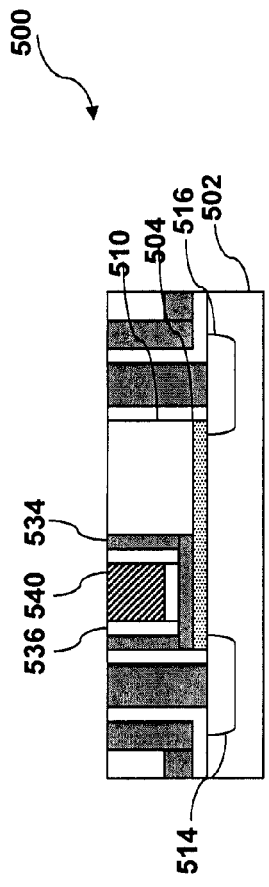

As shown in FIG. 22, after step 364, the method 350 may proceed in two different routes for fabricating the memory device 500 and the memory device 550 respectively. In one embodiment, the method 350 may proceed to step 366 by forming the memory gate 540 as shown in FIG. 29. The step 366 includes removing the memory gate layer 540 outside the memory gate region 530, the oxide layer 538, and the nitride layer 536 shown in FIG. 28 using an etching process, a CMP process, or a combination thereof. The method 350 proceeds to step 368 by forming a control gate 544 as shown in FIG. 30. The step 368 includes using a lithography process to define the control gate region 532, removing the polysilicon layer 510 using the etching process. The method 350 further includes depositing the high-k dielectric layer 406 over the interfacial layer 404, depositing the metal nitride layer 508 over the high-k dielectric layer 506, and filling the control gate region 532 with a metal or a metal alloy over the metal nitride layer 508. The step 368 may include a CMP process. The method 350 proceeds to step 370 by forming a metal line 548 connecting the memory gate 440 and a metal line 550 connecting the control gate 444 as shown in FIG. 31 by a BOEL processes. The step 370 may include depositing a protection layer 546 over the top of the structure. The protection layer 446 may include SiN, SiO, or a compound thereof. The step 370 further includes using a lithograph process and an etching process to define the location and the critical dimension (CD) of the metal line 548 and the metal line 550. The step 370 also includes metal deposition and a CMP process to form the metal line 548 and the metal line 550. In the embodiment of fabricating the memory structure 500, additional steps can be provided before, during, and after the method 350, and some the steps described can be replaced, eliminated, or moved around for additional embodiments of the method 350.

As shown in FIG. 22, in another embodiment, after step 364, the method 350 may proceed in another route for fabricating a flash memory structure 550. The method 350 may proceed to step 372 by forming a buried memory gate 542 as shown in FIG. 32. The step 372 includes removing the gate layer 540 outside the memory gate region 530 and the oxide layer 538 as shown in FIG. 28 using an etching process, a CMP process, or a combination thereof. The step 372 also include recessing the memory gate 540 in the memory gate region 530 and depositing the oxide on the top forming the buried memory gate 542 surrounding by the oxide layer 536 as shown in FIG. 32. The method 350 proceeds to step 374 by forming the control gate 544 as shown in FIG. 33. The step 374 includes using a lithography process to define the control gate region 532, removing the polysilicon layer 510 using an etching process, and filling the control gate region 532 with a metal or a metal alloy. The step 374 may also include using a CMP process. The method 300 proceeds to step 376 by forming the metal line 548 connecting the buried memory gate 542 and the metal line 550 connecting the control gate 444 as shown in FIG. 34 by a BOEL process. The step 376 may include depositing a protection layer 446 over the top of the structure. The protection layer 546 may include SiN, SiO, or a compound thereof. The step 376 further includes using lithograph and etching processes to define the location and the CD of the metal line 548 and the metal line 550. The step 376 also includes a metal deposition process and a CMP process to form the metal line 548 and the metal line 550. In the embodiment of fabricating the memory structure 550, additional steps can be provided before, during, and after the method 350, and some the steps described can be replaced, eliminated, or moved around for additional embodiments of the method 350.

In the foregoing discussion, by fabricating the memory structure 400, the memory structure 450, the memory structure 500, or the memory structure 550, various layers, such as the interfacial layer, dielectric layer and the metal layer, may be deposited by a physical vapor deposition (PVD) process such as evaporation and DC magnetron sputtering, a plating process such as electrode-less plating or electroplating, a chemical vapor deposition (CVD) process such as atmospheric pressure CVD (APCVD), a low pressure CVD (LPCVD), a plasma enhanced CVD (PECVD), or a high density plasma CVD (HDP CVD), an ion beam deposition, spin-on coating, a metal-organic decomposition (MOD), an atomic layer deposition (ALD) process and/or other suitable methods. A lithography process may include depositing a resist film on the substrate, exposing the resist film deposited on the substrate by an optical lithography tool or an electron beam writer, and developing the exposed resist film to form a resist pattern for an ion implantation process or an etching process. The lithography process may include a soft bake (SB), a post exposure bake (PEB), or a post develop bake (PDB) process. The etching process may include a dry (plasma) etching, a wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Thus, the present disclosure describes a method of forming a memory device. In some embodiments, the method includes receiving a wafer substrate, forming a poly stack pattern on the wafer substrate, performing an ion implantation process to form a source and a drain in the wafer substrate, forming a memory gate in the poly stack pattern, and forming a control gate in the poly stack pattern. The poly stack pattern includes an interfacial layer deposited over the wafer substrate, a high-k dielectric layer deposited over the interfacial layer, a metal nitride layer deposited over the high-k dielectric layer, a polysilicon layer deposited over the metal nitride layer, and a hard mask layer deposited over the polysilicon layer. The method further includes removing the hard mask layer after forming the source and the drain. Forming the memory gate includes forming a memory gate region in the poly stack pattern by removing the poly silicon layer, the metal nitride layer, and the high-k dielectric layer in the memory gate region. Forming the memory gate further includes depositing a nitride layer over the interfacial layer, depositing an oxide layer over the nitride layer, and depositing a memory gate layer over the oxide layer. Forming the memory gate further includes performing a chemical mechanical polishing (CMP) process to remove the memory gate layer, the oxide layer, and the nitride layer outside the memory gate region so that the memory gate is formed in the memory gate region. Forming the memory gate further includes performing a memory gate recess etching process to bury the memory gate inside the oxide layer in the memory gate region. Forming the control gate includes removing the polysilicon layer in a control gate region and depositing the control gate layer over the interfacial layer in the control gate region.

In other embodiments, the method includes receiving a wafer substrate, forming a poly stack pattern on the wafer substrate, performing an ion implantation process to form a source and a drain in the wafer substrate, forming a memory gate in the poly stack pattern, and forming a control gate in the poly stack pattern. The poly stack pattern includes an interfacial layer deposited over the wafer substrate, a polysilicon layer deposited over the interfacial layer, and a hard mask layer deposited over the polysilicon layer. The method further includes removing the hard mask layer after forming the source and the drain. Forming the memory gate includes forming a memory gate region in the poly stack pattern by removing the poly silicon layer in the memory gate region. Forming the memory gate further includes depositing a nitride layer over the interfacial layer, depositing an oxide layer over the nitride layer, depositing the memory gate material over the oxide layer in the memory gate region. Forming the memory gate further includes performing a chemical mechanical polishing (CMP) process to remove the memory gate layer, the oxide layer, and the nitride layer outside the memory gate region so that the memory gate is formed in the memory gate region. Forming the memory gate further includes performing a memory gate recess etching process to bury the memory gate inside the oxide layer in the memory gate region. Forming the control gate includes removing the poly silicon layer in a control gate region, depositing a high-k dielectric layer over the interfacial layer, depositing a metal nitride layer over the high-k dielectric layer, and depositing a control gate material over the metal nitride layer in the control gate region.

In some embodiments, a memory structure is described. The memory structure includes a wafer substrate, a source formed in the wafer substrate, a drain formed in the wafer substrate, a poly stack pattern siting over the source at one end of the poly stack pattern and over the drain at another end of the poly stack pattern, wherein the poly stack pattern includes a memory gate configured to form over the source, and a control gate configured to form over the drain. The memory gate is separated with the wafer substrate by an interfacial layer deposited over the wafer substrate, a nitride layer deposited over the interfacial layer, and a oxide layer deposited over the nitride layer. In one embodiment, the memory gate is formed over the oxide layer. In another embodiment, the memory gate is further buried inside the oxide layer. The control gate is separated with the wafer substrate by the interfacial layer deposited over the wafer substrate, a high-k dielectric layer deposited over the interfacial layer, and a metal nitride layer deposited over the high-k dielectric layer. The control gate is formed over the metal nitride layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a memory device, the method comprising:
   receiving a wafer substrate;
   forming a poly stack pattern on the wafer substrate, wherein the poly stack pattern includes an interfacial layer deposited over the wafer substrate, a high-k dielectric layer deposited over the interfacial layer, a metal nitride layer deposited over the high-k dielectric layer, a polysilicon layer deposited over the metal nitride layer, and a hard mask layer deposited over the polysilicon layer;
   performing an ion implantation process to form a source and a drain in the wafer substrate;
   forming a memory gate in the poly stack pattern over the source, wherein forming the memory gate includes forming a memory gate region in the poly stack pattern by removing the poly silicon layer, the metal nitride layer, and the high-k dielectric layer in the memory gate region; and
   forming a control gate in the poly stack pattern over the drain.

2. The method of claim 1, further comprising removing the hard mask layer after forming the source and the drain.

3. The method of claim 1, further comprising depositing a nitride layer over the interfacial layer, depositing an oxide layer over the nitride layer, and depositing a memory gate layer over the oxide layer.

4. The method of claim 1, further comprising performing a chemical mechanical polishing (CMP) process to remove the memory gate layer, the oxide layer, and the nitride layer outside the memory gate region so that the memory gate is formed in the memory gate region.

5. The method of claim 4, further comprising performing a memory gate recess etching process to bury the memory gate inside the oxide layer in the memory gate region.

6. The method of claim 1, wherein forming the control gate includes removing the polysilicon layer in a control gate region and depositing the control gate layer over the interfacial layer in the control gate region.

7. A method of forming a memory device, the method comprising:
   receiving a wafer substrate;
   forming a poly stack pattern on the wafer substrate, wherein the poly stack pattern includes an interfacial layer deposited over the wafer substrate, a polysilicon layer deposited over the interfacial layer, and a hard mask layer deposited over the polysilicon layer;
   performing an ion implantation process to form a source and a drain in the wafer substrate;
   forming a memory gate in the poly stack pattern over the source; and
   forming a control gate in the poly stack patter over the drain, wherein forming the control gate includes removing the poly silicon layer in a control gate region, depositing a high-k dielectric layer over the interfacial layer, depositing a metal nitride layer over the high-k dielectric layer, and depositing a control gate material over the metal nitride layer in the control gate region.

8. The method of claim 7, further comprising removing the hard mask layer after forming the source and the drain.

9. The method of claim 7, wherein forming the memory gate includes forming a memory gate region in the poly stack pattern by removing the poly silicon layer in the memory gate region.

10. The method of claim 9, further comprising depositing a nitride layer over the interfacial layer, depositing an oxide layer over the nitride layer, depositing the memory gate material over the oxide layer in the memory gate region.

11. The method of claim 10, further comprising performing a chemical mechanical polishing (CMP) process to remove the memory gate material, the oxide layer, and the nitride layer outside the memory gate region so that the memory gate is formed in the memory gate region.

12. The method of claim 10, further comprising performing a memory gate recess etching process to bury the memory gate inside the oxide layer in the memory gate region.

13. A method of forming a memory device, the method comprising:
   receiving a wafer substrate;
   forming a poly stack pattern on the wafer substrate, wherein the poly stack pattern includes an interfacial layer deposited over the wafer substrate, a dielectric layer deposited over the interfacial layer, and a polysilicon layer deposited over the dielectric layer;
   performing an ion implantation process to form a source and a drain in the wafer substrate;
   forming a memory gate in the poly stack pattern over the source, wherein forming the memory gate includes:
      removing a portion of the polysilicon layer and a portion of the dielectric layer to expose a portion of the interfacial layer; and
      forming a memory gate layer over the portion of the interfacial; and
   forming a control gate in the poly stack pattern over the drain.

14. The method of claim 13, wherein the poly stack pattern further includes a hard mask layer over the polysilicon layer, the method further comprising removing the hard mask layer after forming the source and the drain.

15. The method of claim 13, wherein forming the memory gate includes forming a memory gate region in the poly stack pattern by removing the poly silicon layer and the dielectric layer in the memory gate region.

16. The method of claim 15, further comprising depositing a nitride layer over the interfacial layer.

17. The method of claim 13, wherein forming the control gate includes removing the polysilicon layer in a control gate region and depositing the control gate layer over the interfacial layer in the control gate region.

18. The method of claim 13, wherein the poly stack pattern further includes a metal nitride layer, and
wherein removing the portion of the polysilicon layer and the portion of the dielectric layer to expose the portion of the interfacial layer further includes removing a portion of the metal nitride layer to expose the portion of the interfacial layer.

19. The method of claim 13, wherein forming the memory gate in the poly stack pattern over the source further includes:
recessing the memory gate layer; and
forming another dielectric layer directly on the recessed memory gate layer.

\* \* \* \* \*